(12) United States Patent
Tokuhiro

(10) Patent No.: US 8,976,619 B2
(45) Date of Patent: Mar. 10, 2015

(54) SEMICONDUCTOR APPARATUS

(71) Applicant: Fujitsu Limited, Kawasaki-shi, Kanagawa (JP)

(72) Inventor: Noriyuki Tokuhiro, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/196,345

(22) Filed: Mar. 4, 2014

(65) Prior Publication Data

US 2014/0185391 A1    Jul. 3, 2014

Related U.S. Application Data

(63) Continuation of application No. PCT/JP2011/071525, filed on Sep. 21, 2011.

(51) Int. Cl.
*G11C 7/22*    (2006.01)
*G06F 13/16*    (2006.01)

(52) U.S. Cl.
CPC ............... *G11C 7/222* (2013.01); *G06F 13/16* (2013.01); *G06F 13/1689* (2013.01)
USPC ................. 365/233.11; 365/233.17; 365/194; 327/153

(58) Field of Classification Search
USPC .......... 365/189.07, 193, 194, 233.11, 233.12, 365/233.17; 327/149, 153, 158, 161
See application file for complete search history.

(56) References Cited

U.S. PATENT DOCUMENTS

| 2008/0192563 | A1* | 8/2008 | Cho ......................... 365/233.17 |
| 2009/0129179 | A1 | 5/2009 | Yamazaki |
| 2011/0047319 | A1* | 2/2011 | Jeon et al. ..................... 711/103 |
| 2011/0205832 | A1 | 8/2011 | Jeon |
| 2012/0226884 | A1 | 9/2012 | Tokuhiro et al. |
| 2012/0242385 | A1 | 9/2012 | Tokuhiro |
| 2012/0269016 | A1* | 10/2012 | Park et al. ..................... 365/194 |

FOREIGN PATENT DOCUMENTS

| JP | 2009-130455 | 6/2009 |
| JP | 2011-176816 | 9/2011 |
| WO | 2011/077573 A1 | 6/2011 |
| WO | 2011/077574 A1 | 6/2011 |

OTHER PUBLICATIONS

International Search Report mailed Dec. 27, 2011 in corresponding International Patent Application No. PCT/JP2011/071525.

* cited by examiner

*Primary Examiner* — Harry W Byrne
*Assistant Examiner* — Lance Reidlinger
(74) *Attorney, Agent, or Firm* — Staas & Halsey LLP

(57) ABSTRACT

A semiconductor apparatus includes a phase detecting unit that continuously detects a first delay amount during a read operation, based on a phase difference between an external clock signal and an internal clock signal; a generating unit that generates a second control signal by delaying a first control signal by a second delay amount that when added to the first delay amount, the sum is a specific time period, a valid time period of the first control signal starts when the read operation starts and is at least to equal a read time for one data signal and less than the specific time period that is from the start of the read operation until output of a received data signal; and a delay control unit that delays the data signal by the first delay amount detected at a start of a valid time period of the generated second control signal.

4 Claims, 15 Drawing Sheets

FIG.4

| NINE-DIGIT BINARY NUMBER | DQPHASE | | |
|---|---|---|---|
| | ☐ ☐ ☐ ☐ | ☐ | ☐ ☐ ☐ ☐ |
| | NUMBER OF ROUNDS: REPRESENTS HOW MANY ROUNDS PHASE GOES | CLOCK SELECTION PORTION: SELECTION OF CLK USING 180 DEGREES AS UNIT | DL PORTION: ADJUSTMENT OF DELAY LESS THAN 180 DEGREES |

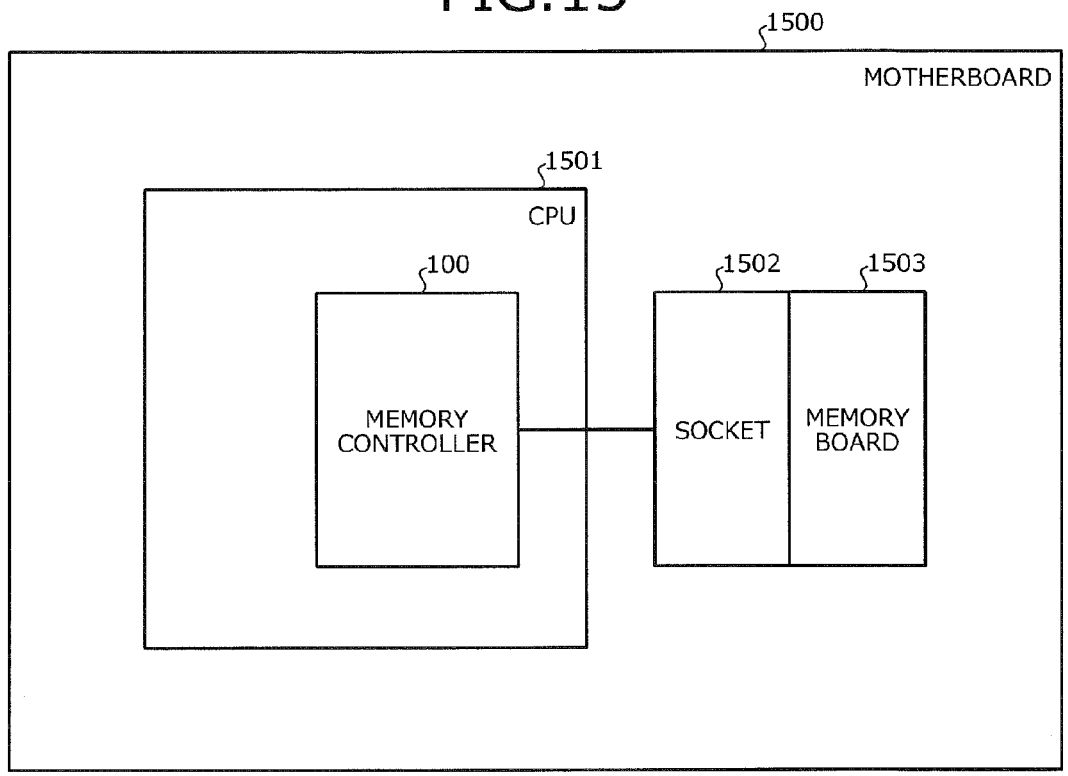

SEMICONDUCTOR APPARATUS

CROSS REFERENCE TO RELATED APPLICATIONS

This application is a continuation application of International Application PCT/JP2011/071525, filed on Sep. 21, 2011 and designating the U.S., the entire contents of which are incorporated herein by reference.

FIELD

The embodiment discussed herein is related to a semiconductor apparatus.

BACKGROUND

A double data rate (DDR) memory interface (JEDEC JESD79-3E) has conventionally been present as a high speed memory interface standard. The DDR memory interface is used for RAM that is used in a personal computer and configured by a semiconductor circuit, such as, for example, a DDR synchronous dynamic random access memory (SDRAM).

With the DDR memory interface, content can be written to and read from RAM according to a request (command) from a memory controller. The DDR memory is memory that transfers data at a data transfer rate that is twice as high as the clock frequency by inputting and outputting the data at both the rising edge (positive edge) and the falling edge (negative edge) of the clock signal.

The DDR memory transmits to a dual in-line memory module (DIMM), an internal clock signal (CK signal) generated in the memory controller. The DIMM generates a data strobe signal (DQS signal) using the CK signal received from the DDR memory and transmits the DQS signal together with data signals (DQ signals) to the memory controller.

The memory controller receives the DQS and the DQ signals, retimes the DQ signals using the DQS signal, and newly employs the internal clock. In this case, to securely receive the data signals using a latch circuit at the reception point, the timing relation between the internal CK signal and the received data signal needs to be within a specific range.

According to a related technique, when a signal is to be delayed for a time period from the input thereof to the output thereof, the necessary delay time period is generated by disposing a circuit to generate a fine delay and a circuit to generate a coarse delay, and using a combination of the circuits (see, e.g., Japanese Laid-Open Patent Publication No. 2009-130455).

However, when a reading operation is executed, the time period from the time when the memory controller issues a read command until the time when the DQS and the DQ signals return to the memory controller (=flight time) varies. Factors causing variations may include, for example, the positions of the memory controller and the DIMM, the power source, and environmental variations such as temperature variations. When multi-slot DIMMs are mounted on the same DIMM channel, the variation differs according to the DIMM slot to be accessed.

When reading operations or writing operations are successively executed for multiple slots, suppression of the variation while the slots are switched at a high speed is difficult.

SUMMARY

According to an aspect of an embodiment, a semiconductor apparatus includes a phase detecting unit that continuously detects a first delay amount during a read operation, based on a phase difference between a received external clock signal and an internal clock signal; a generating unit that generates a second control signal by delaying a first control signal by a second delay amount that when added to the first delay amount, a sum of the first and the second delay amounts is a specific time period, a valid time period of the first control signal starts at a start of the read operation and is at least to equal a read time for one data signal and less than the specific time period that is from the start of the read operation until output of a received data signal; and a delay control unit that delays the data signal by the first delay amount that is detected by the phase detecting unit at a start of a valid time period of the second control signal generated by the generating unit.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 4 is an explanatory diagram of an example of a DQPHASE signal;

FIG. 15 is a block diagram of an example of a motherboard.

DESCRIPTION OF EMBODIMENTS

First embodiment of a semiconductor apparatus will be described in detail with reference to the accompanying drawings. In the embodiment, although a memory controller will be described as one example of the semiconductor apparatus, the semiconductor apparatus is not limited hereto and may be, for example, a central processing unit (CPU), a motherboard, and the like.

In first embodiment, even when the valid time period of a control signal setting the delay amount of a data signal that continuously changes is short to substantially be a read time of one data signal, a control signal is delayed such that the sum of the delay amount of the control signal and that of the data signal is a specific time period. The control signal can be made effective during execution of a delay process for the data signal. Thereby, the speed at which the operations are switched can be increased for successive operations (reading or writing) while maintaining the time period for response to the data signal to be the specific time period. Therefore, the overall operation time period can be reduced for the successive operations.

Figure 1:
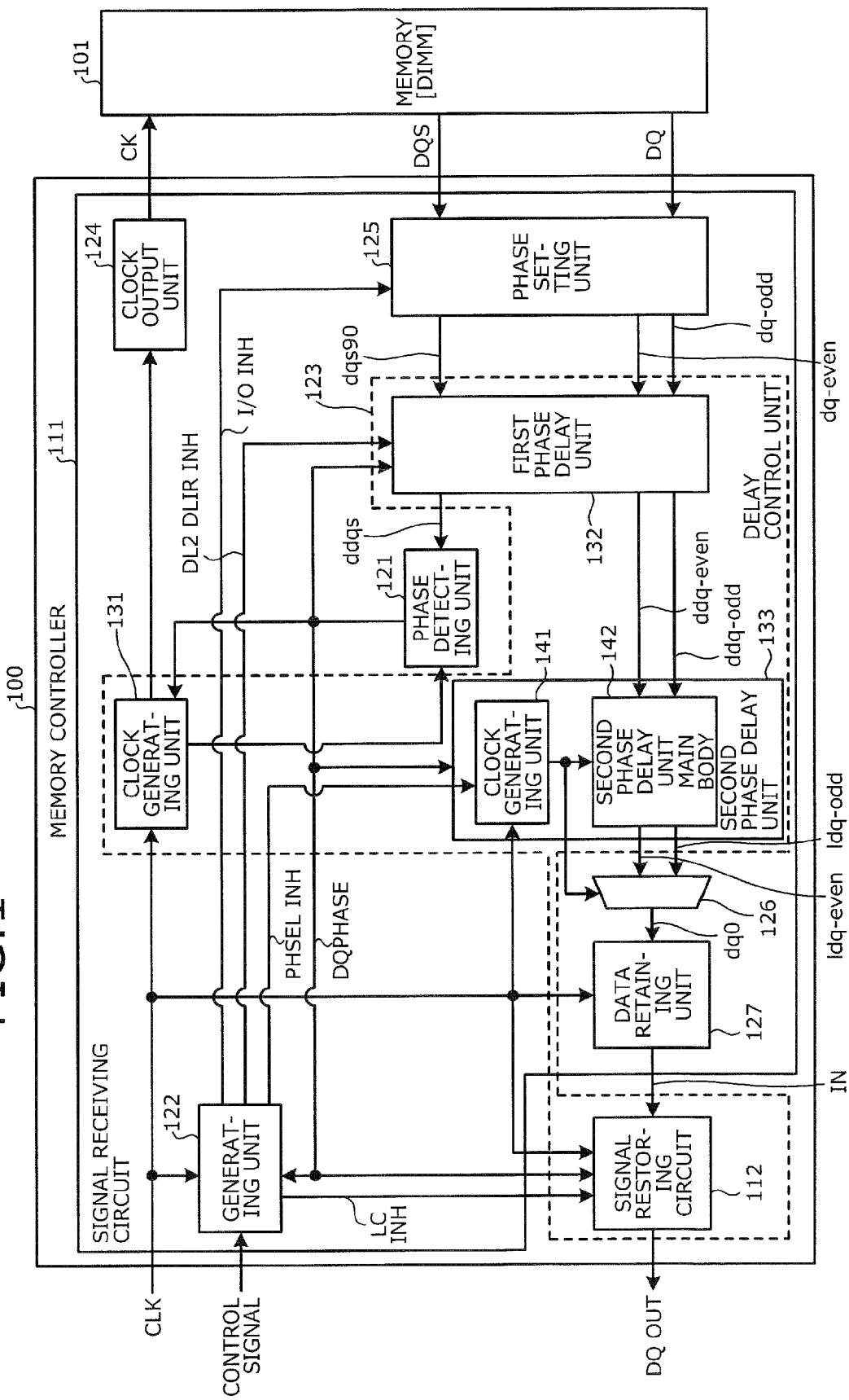
FIG. 1 is a block diagram of an example of a semiconductor apparatus according to first embodiment.

FIG. 1 is a block diagram of an example of the semiconductor apparatus according to the first example. In FIG. 1, a memory controller 100 is taken as an example of the semiconductor apparatus. The memory controller 100 is an example of the memory controller 100 disclosed herein, is an interface circuit for memory 101, and is an input and output unit for data.

The memory controller 100 receives, for example, a DQS signal as an external clock signal and a DQ signal as a data signal from the memory 101 (DIMM). In this case, the memory 101 is a signal source and is, for example, a DDR SDRAM. The DDR SDRAM transfers data at a rate twice as high as that of the clock (CK) signal (at both the rising and the falling edges of the clock signal).

The memory controller 100 includes a signal receiving circuit 111, and a signal restoring circuit 112. The signal receiving circuit 111 includes a generating unit 122, a clock generating unit 131, a clock output unit 124, a phase setting unit 125, a first phase delay unit 132, a second phase delay unit 133, a phase detecting unit 121, and a data retaining unit 127. Each of these components is realized by an analog circuit, a logic circuit, an FF, etc.

Signals will be described. The DQS signal, a dqs90 signal, and a ddqs signal are data strobe signals. A CLK signal, an output signal of the clock generating unit 131, and an output signal of a clock generating unit 141 are internal clock signals. The DQ signal, a dq-odd signal, a dq-even signal, a ddq-even signal, a ddq-odd signal, an ldq-even signal, an ldq-odd signal, a dq0 signal, and an IN signal are data signals.

A delay control unit 123 includes a clock generating unit 131, a first phase delay unit 132, a second phase delay unit 133, and a signal restoring circuit 112. After the specific time period elapses from the time when a reading operation is started, the delay control unit 123 can cause the data signal to synchronize with the CLK signal and to be output as a DQ OUT signal.

In the delay control unit 123, for example, the clock generating unit 131, the first phase delay unit 132, and the second phase delay unit 133 delay the DQ signal to generate the data signal that synchronizes with the reference CLK signal; and the signal restoring circuit 112 outputs the data signal as a DQ OUT signal when the specific time period elapses after the time when the reading operation is started.

In the first embodiment, a DQPHASE signal is a delay signal and represents the delay amount of the components of the delay control unit 123. The delay amount is not determined when the DQPHASE signal changes in a case where the components of the delay control unit 123 are delaying the data signal based on the DQPHASE signal. Therefore, a problem arises in that a logical glitch pulse is generated on the data signal and that the data signal is shifted. Each component of the delay control unit 123 prevents the DQPHASE signal from changing, based on the control signal when the data signal is being delayed.

The clock generating unit 131 frequency-divides the CLK signal and generates a multi-phase CLK signal. The clock output unit 124 receives the CLK signal from the clock generating unit 131, generates the CK signal, and outputs the CK signal to the memory 101.

When the data is read from the memory 101, the memory 101 generates the DQS signal from the CK signal received from the memory controller 100 and generates the DQ signal that is synchronized with the DQS signal. The DQS and the DQ signals have the same phase.

During the read time, the phase detecting unit 121 continuously performs detection of the delay amount based on the phase difference, by comparing a signal at a frequency equal to that of the DQS signal obtained by frequency-dividing the CLK signal by the clock generating unit 131, with the signal obtained by delaying the DQS signal from the first phase delay unit 132. The DQPHASE signal is an information signal that indicates the delay amount based on the phase difference between the signal at the frequency equal to that of the DQS signal obtained by frequency-dividing the CLK signal, and the signal obtained by delaying the DQS signal. Although a more specific example will be described later, the DQPHASE signal includes information concerning the number of rounds, the CLK selection, and the DL. The number of rounds of the DQPHASE signal represents the number of phase rounds. The CLK selection of the DQPHASE signal represents CLK selection using a predetermined phase difference as a unit. The DL of the DQPHASE signal represents a delay adjustment amount that is less than the predetermined phase difference (for example, 180 degrees).

The phase detecting unit 121 stores the DQPHASE signal at the end of the read time. Thereby, when the next read operation is started, the generating unit 122 described later can delay the control signal using the stored DQPHASE signal.

The phase setting unit 125 receives the DQS and the DQ signals from the memory 101 during a time period when an I/O INH signal is "H" (valid time period); and sets a phase shift of a predetermined phase (90 degrees) in the DQS and the DQ signals. The signal obtained by shifting the phase of the DQS signal is the dqs90l signal. The I/O INH signal is information indicating that the phase setting unit 125 is currently executing a reception operation.

The phase setting unit 125 does not receive the DQS and the DQ signals during a time period when the I/O INH signal is "L" (invalid time period); and divides the DQ signal into two data signals that are a data signal at the rising edge of the DQS signal and a data signal at the falling edge thereof (respectively referred to as a "dq-even signal" and a "dq-odd signal") and outputs the two data signals to the first phase delay unit 132.

The first phase delay unit 132 delays the DQS signal by an amount within a range less than the predetermined phase difference, based on the DQPHASE signal obtained when a DL2 DLIR INH signal changes from "L" to "H"; and applies a phase delay to the DQ signal based on the DQPHASE signal obtained when the DL2 DLIR INH signal changes from "L" to "H". For example, the first phase delay unit 132 includes a variable delay circuit, receives the DQPHASE signal, and sets in the DQS signal, a delay amount that is less than the predetermined phase difference.

Even when the phase detecting unit 121 detects that the value of the DQPHASE signal has changed during a time period when the DL2 DLIR INH signal is "H" (valid time period), the first phase delay unit 132 induces on the DQS and the DQ signals, a delay amount based on the value of the DQPHASE signal obtained when the DQPHASE signal changes from "L" to "H". For example, the first phase delay unit 132 may include a latch circuit to store therein the DQPHASE signal obtained when the DL2 DLIR INH signal changes from "L" to "H".

Thereby, even in a case where the phase detecting unit 121 continuously detects the DQPHASE signal, the DQPHASE signal used for the delay amount does not vary when a PHSEL INH signal is "H" during the time period for the first phase delay unit 132 to keep delaying the data signal. Therefore, any logical glitch pulse, etc., generated consequent to the change of the DQPHASE signal can be prevented.

The second phase delay unit 133 determines capture timings of the ddq-odd and the ddq-even signals of a second phase delay unit main body, based on the DQPHASE signal obtained when the PHSEL INH signal changes from "L" to "H". The second phase delay unit 133 maintains the capture timings of the ddq-even and the ddq-odd signals based on the value of the DQPHASE signal obtained when the DQPHASE signal changes from "L" to "H" even in a case where the phase detecting unit 121 detects that the value of the DQPHASE signal changes during the time period when the PHSEL INH signal is "H" (valid time period). For example, the second phase delay unit 133 may include a latch circuit to store therein the DQPHASE signal obtained when the PHSEL INH signal changes from "L" to "H".

For example, the second phase delay unit 133 includes a clock generating unit 141 and the second phase delay unit main body 142. The clock generating unit 141 frequency-divides the CLK signal and generates a multi-phase CLK signal. The clock generating unit 141 selects one frequency-divided CLK signal from the multi-phase CLK signal that is obtained by frequency-division based on the DQPHASE signal obtained when the PHSEL INH signal changes from "L" to "H", and outputs the selected signal to the second phase delay unit main body 142.

The second phase delay unit main body 142 receives the frequency-divided CLK signal from the clock generating unit 141. The second phase delay unit main body 142 captures the ddq-even and the ddq-odd signals based on the DQPHASE signal obtained when the PHSEL INH signal changes from "L" to "H"; and outputs to a selector 126, an ldq-even signal obtained by retiming the ddq-even signal and an ldq-odd signal obtained by retiming the ddq-odd signal.

Thus, even in a case where the phase detecting unit 121 continuously detects the DQPHASE signal, the DQPHASE signal used for the delay amount and the clock selection signal do not change when the PHSEL INH signal is "H" during the time period for the second phase delay unit 133 to keep delaying the data signal. Therefore, logical glitch pulses, etc. generated consequent to the change of the DQPHASE signal can be prevented.

The selector 126 selects plural outputs of the second phase delay unit 133. For example, the selector 126 receives the CLK signal generated by the clock generating unit 141, and alternately selects the ldq-even and the ldq-odd signals based on the CLK signal as selection information. For example, the selector 126 alternately selects the ldq-even signal for the rising edge of the DQS signal and the ldq-odd signal for the falling edge of the DQS signal.

The data retaining unit 127 retains the ldq-even or the ldq-odd signal selected by the selector 126, and newly employs the reference CLK signal as the clock of the data signal. Thus, the data retaining unit 127 can receive from the input side of the clock generating unit 131, input of the reference CLK signal that is supplied from inside or outside of the memory controller 100. The data retaining unit 127 retains the dq0 signal in synchronization with the reference CLK signal, newly employs the reference CLK signal as the clock, and outputs the dq0 signal as an IN signal. The data retaining unit 127 outputs the IN signal to the signal restoring circuit 112.

The phase of the received data in the DQ signal varies due to environmental factors such as the power source voltage and/or the apparatus temperature. Therefore, the received data also varies accordingly after the internal clock is newly employed. In the signal receiving circuit 111, the DQ signal is substantially normalized by the internal clock signal.

However, the received data whose clock phase has changed to the internal clock phase, temporally advances or delays the captured clock, which affects the pulse width causing the pulse width to narrow or widen simultaneously with the switching of the clock, by an amount corresponding to one clock width (=tCK/2=correlation delay difference of a two-phase clock).

The signal restoring circuit 112 executes delay control for the IN signal based on the DQPHASE signal obtained when an LC INH signal changes from "L" to "H"; realizes a process of regenerating the pulse width of the data; and prohibits changes of the DQPHASE signal during the time period when the LC INH signal is "H".

Thus, even in a case where the phase detecting unit 121 continuously detects the DQPHASE signal, the DQPHASE signal used for the delay amount and the clock selection signal do not change when the LC INH signal is "H" during the time period for the signal restoring circuit 112 to keep delaying the data signal (IN signal). Therefore, logical glitch pulses, etc. generated consequent to the variation of the DQPHASE signal can be prevented. For example, the signal restoring circuit 112 may include a latch circuit to store therein the DQPHASE signal obtained when the LC INH signal changes from "L" to "H".

For example, the signal restoring circuit 112 has a first-in first-out (FIFO) function that is sufficient to absorb deviations in delay of data, and corresponding to the delay amount retained by the DQPHASE signal, increases or decreases the delay time period for passage via FIFO. Thus, the delay of the received signal output from the signal receiving circuit 111, that is, the DQ signal is maintained to be constant and the data pulse width is regenerated.

The signal restoration process executed by the signal restoring circuit 112 will be further described. When the delay amount of the DQPHASE signal increases (=when the delay increases because of the switching of the clock), passage via FIFO merely has to be expedited by the delay amount. When the delay amount of the DQPHASE signal decreases, passage via FIFO merely has to be delayed by the delay amount. In this manner, using the increase or the decrease of the delay amount, the data signal can be output when a specific time period elapses after the time when the read operation is started. Therefore, deviations in responses concerning the read data can be prevented.

The data pulse width is always constant and the output signal of the signal restoring circuit 112 (DQ OUT signal) is generated. The DQ OUT signal acts as a stable, received signal. The original data signal can faithfully be restored.

The generating unit 122 generates new control signals by delaying the control signal by an amount that when added to the delay amount by which the data signal (IN signal) is delayed by the signal restoring circuit 112, the sum is the specific time period. The new control signals are the I/O INH signal, the DL2 DLIR INH signal, the PHSEL INH signal, and the LC INH signal. The difference in the delay amount among the I/O INH signal, the DL2 DLIR INH signal, the PHSEL INH signal, and the LC INH signal are determined in advance based on the circuit configuration of each of the components to be controlled.

The time period that the I/O INH signal, the DL2 DLIR INH signal, the PHSEL INH signal, and the LC INH signal are to be "H" (valid time period) may be the same the time period that the control signal is "H" (valid time period) or may include a margin with respect to the time period when the control signal is "H". The I/O INH signal controls the reception of the DQ and the DQS signals and therefore, by causing the I/O INH signal to include a margin, the capture precision of the DQ and the DQS signals can be improved.

Figure 2:
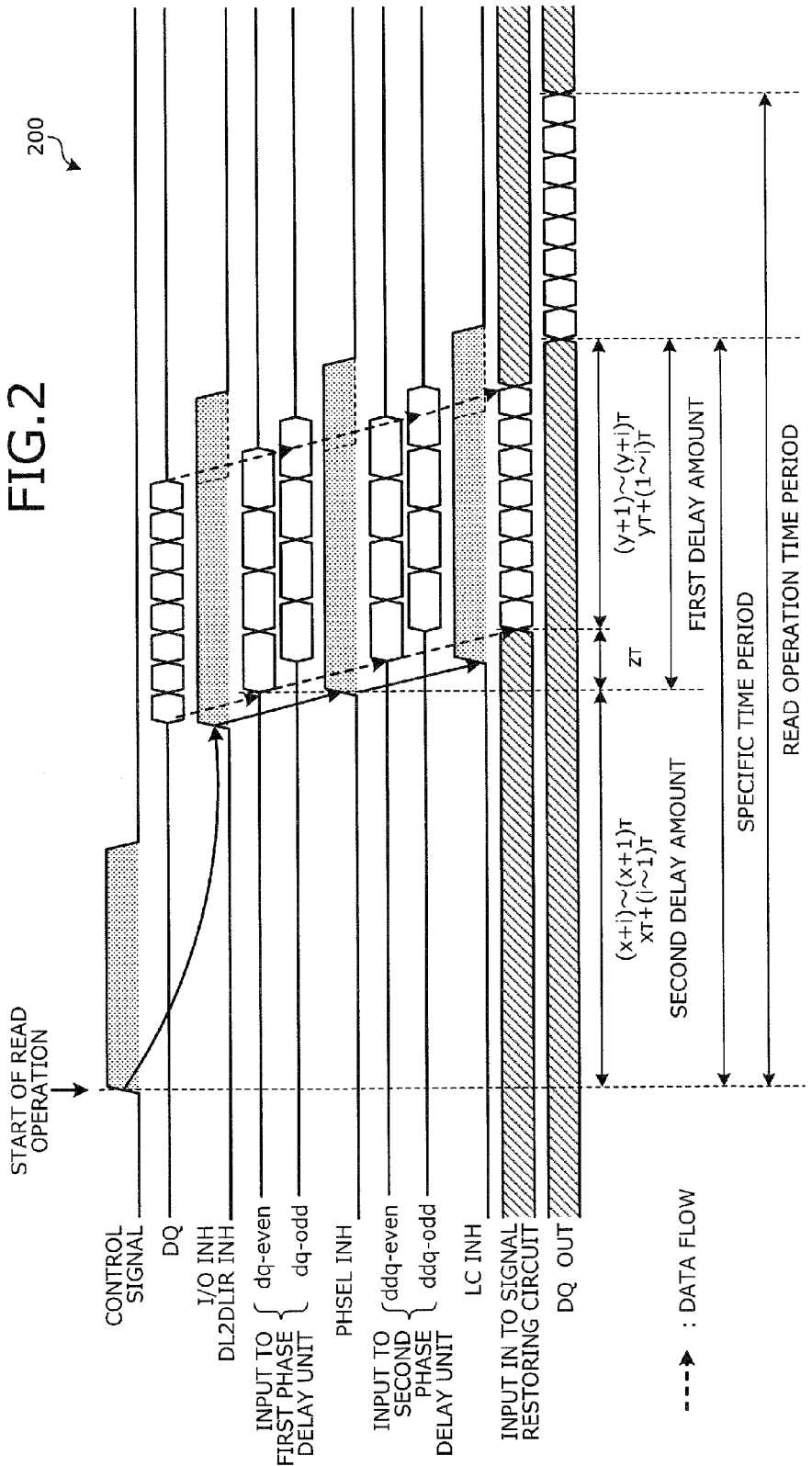
FIG. 2 is a timing chart of an operation example of first embodiment.

FIG. 2 is a timing chart of an operation example of the embodiment. As depicted in a timing chart 200, the time period from the start of the read operation to the output of the read data is the specific time period. "τ" is 1/reference CLK signal. In FIG. 2, "x", "y", "z", and "i" are fixed values determined in advance during the design by the design engineer of the semiconductor apparatus.

For example, the time period from the time of the rising edge of the control signal until the time when the read data is output from the DQ OUT signal is set to be constant by the signal restoring circuit 112 and the generating unit 122 depicted in FIG. 1. For example, the delay time period corresponding to a second delay amount that is a time period from the time of the rising edge of the control signal until the time of the rising edge of the PHSEL INH signal is xτ+(i to 1)T. For example, the delay time period corresponding to a first delay amount that is a time period from the time when the read data is input into the signal restoring circuit 112 until the time when the data signal appears in the DQ OUT signal is yτ+(1 to i)τ. "(1 to i)" and "(i to 1)" are determined based on the DQPHASE signal. The first and the second delay amounts are inverses of one another.

For example, when x, y, z, and i are x=6, y=1, z=2, and i=16, the time period until the time when the read data is output from the DQ OUT signal is 24T. The time period from the time of the rising edge of the control signal until the time of the rising edge of the PHSEL INH signal is 6+(16 to 1)τ, that is, 22 to 7τ. The time period from the time when the read data is input into the signal restoring circuit 112 until the time when the read data is output from the DQ OUT signal is 1+(1 to 16)τ, that is, 2 to 17τ.

According to the first embodiment, as depicted in FIG. 2, the sum of the delay amount by which the read data signal is delayed and the delay amount by which the control signal is delayed is maintained to be constant. Thereby, the valid time period is established for the control signal only during the time period to execute the delay process for the read data signal. Therefore, generation in the read data signal can be prevented from being affected by changes of the DQPHASE signal when the valid time period of the control signal is not the overall read time but the read time of at least one data signal. The valid time period of the control signal can be reduced and therefore, the switching speed of the successive operations can be increased. Consequently, the total operation time period for the successive operations can be reduced.

In a second embodiment, a detailed example will be described of each of the components of the memory controller described in the first embodiment. Therefore, in the second embodiment, the same effect as that of the first embodiment can be achieved. In the second embodiment, components identical to those of the first example will be given the same reference numerals used in the first embodiment.

Figure 3:
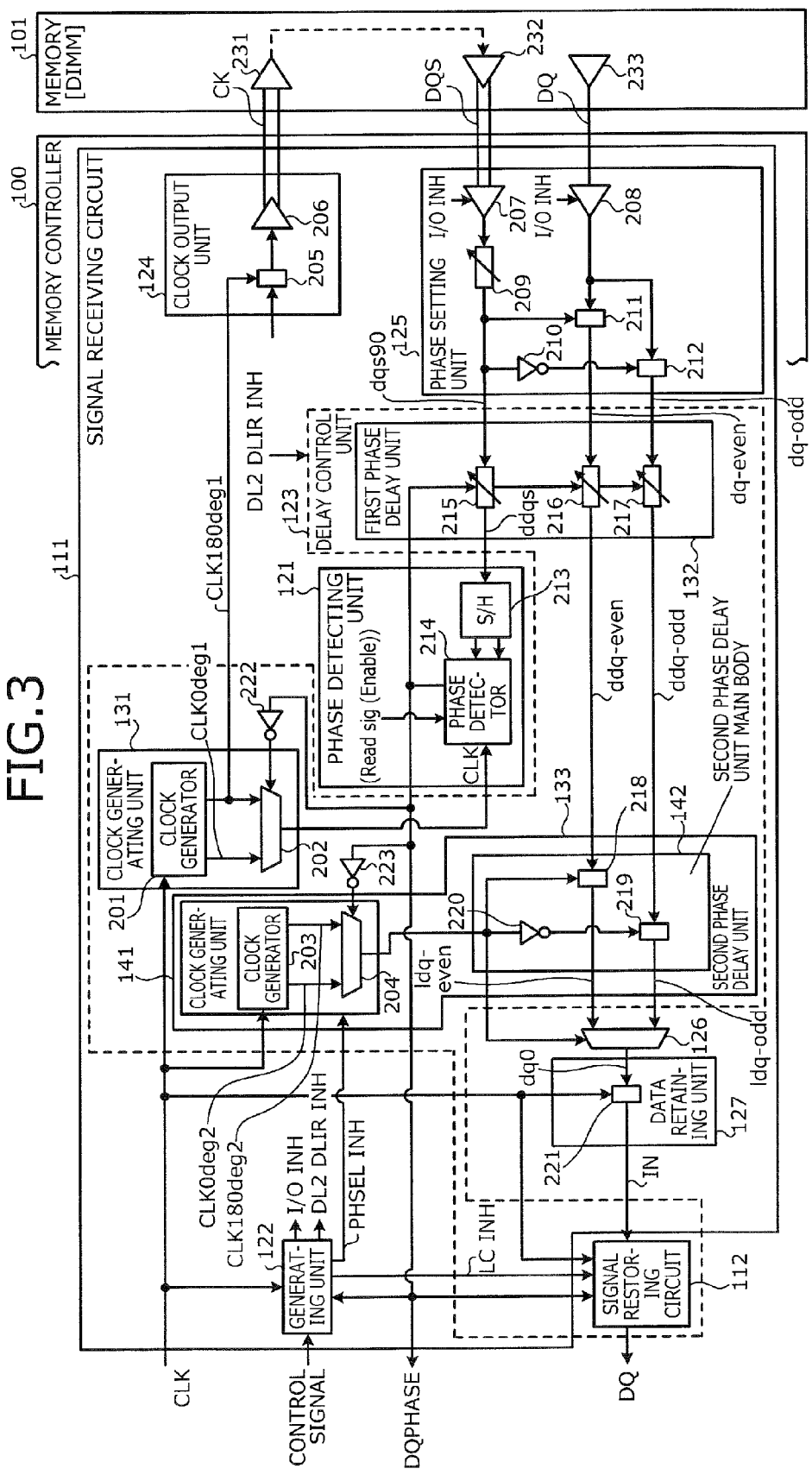
FIG. 3 is a block diagram of an example of the semiconductor apparatus according to second embodiment.

FIG. 3 is a block diagram of an example of the semiconductor apparatus according to the second embodiment. The clock generating unit 131 includes a clock generator 201 and a selector 202. The clock generator 201 generates a multiphase CLK signal. For example, the clock generator 201 may include a frequency-dividing circuit, and frequency-divides the CLK signal using the frequency-dividing circuit and generates the multi-phase CLK signal.

For example, the clock generator 201 frequency-divides a CLK signal of 2 [GHz] into two, obtains CLK signals each of 1 [GHz], and generates CLK signals of two phases, 0 degrees and 180 degrees (respectively referred to as "CLK0deg1 signal" and "CLK180deg1 signal").

The selector 202 outputs to the phase detecting unit 121, any one among the CLK0deg1 and the CLK180deg1 signal, using as a selection signal, the value obtained by inverting the DQPHASE signal (although described later, the value of the fifth bit from the lowest bit of the DQPHASE signal) by an inverter 222.

The clock output unit 124 includes a flip-flop (FF) 205 and an output buffer 206, receives the 180-degree CLK signal (CLK180deg1) from the clock generator 201, and outputs the CK signal to the memory 101. Two CK signals are indicated between the output buffer 206 of the clock output unit 124 and an input buffer 231 of the memory 101 because the two CK signals represent a differential pair. For example, in the clock output unit 124, the FF 205 receives the CLK180deg1 signal and the output buffer 206 outputs the CK signal to the memory 101 using the output of the FF205.

When data is read from the memory 101, the memory 101 generates the DQS signal from the CK signal received by the input buffer 231, and generates the DQ signal that is synchronized with the DQS signal. In the memory 101, an output buffer 232 outputs the DQS signal and an output buffer 233 outputs the DQ signal. The DQS and the DQ signals have the same phase.

The phase setting unit 125 receives the DQS and the DQ signals during the time period when the I/O INH signal is "H", sets a predetermined phase (90 degrees) in the received signals, and on the DQS signal side, includes an input buffer 207, a delay circuit (hereinafter, simply referred to as "DL") 209, and an inverter 210 and, on the DQ signal side, includes an input buffer 208 and FFs 211 and 212.

The input buffer 207 receives the DQS signal during the time period when the I/O INH signal is "H", outputs the DQS signal to an internal destination, and does not deliver the DQS signal to the internal destination during the time period when the I/O INH signal is "L". The DL 209 induces a phase shift of 90 degrees on the DQS signal received by the input buffer 207 and outputs the dqs90 signal. The DQS signal passing through the DL 209 is a CLK signal of 1 [GHz].

The input buffer 208 receives the DQ signal during the time period when the I/O INH signal is "H", outputs the DQ signal to an internal destination, and does not deliver the DQ signal to the internal destination during the time period when the I/O INH signal is "L". The FF 211 synchronizes the DQ signal received by the input buffer 208 with the dqs90 signal, captures the DQ signal, and outputs the DQ signal as the dq-even signal. The FF 212 synchronizes the DQ signal received by the input buffer 208 with a signal obtained by inverting the dqs90 signal by the inverter 210, captures the DQ signal, and outputs the DQ signal as the dq-odd signal. In this case, the FFs 211 and 212 divide the DQ signal into the data signal at the time of the rising edge of the dqs90 signal (dq-even signal) and the data signal at the time of the falling edge of the dqs90 signal (dq-odd signal).

The first phase delay unit 132 delays the phase of the dqs90 signal by an amount less than 180 degrees, based on the DQPHASE signal obtained when the DL2 DLIR INH signal changes from "L" to "H"; and delays the dq-even and the dq-odd signals, based on the DQPHASE signal obtained when the DL2 DLIR INH signal changes from "L" to "H".

The first phase delay unit 132 includes delay circuits (DLs) 215, 216, and 217. The DLs 215 to 217 each set a variable delay amount in a signal input thereto and output the signal. The DL 215 receives the DQPHASE signal (although described later, the lowest four bits of the DQPHASE signal); sets in the dqs90 signal, a delay amount less than 180 degrees that is the limit value of the delay capacity of the DL 215; and outputs the ddqs signal.

The DL 216 delays the dq-even signal from the FF 211 and the DL 217 delays the dq-odd signal from the FF 212. The phase delay in this case is a delay amount less than 180 degrees, which is the limit value of the delay capacity of each of the DLs 216 and 217.

For example, the first phase delay unit 132 may include a latch circuit to store therein the DQPHASE signal obtained when the DQPHASE signal changes from "L" to "H", and may output to the DLs 215 to 217, the signal output from the latch circuit. Thereby, even in a case where the phase detecting unit 121 continuously detects the DQPHASE signal, the DQPHASE signal used for the delay amount does not change when the DL2 DLIR INH signal is "H" during the time period for the first phase delay unit 132 to keep delaying the data signal.

The phase detecting unit 121 compares the clock signal generated by the clock generating unit 131 and the ddqs signal obtained by setting the phase in the dqs90 signal, during the read operation time period (a time period for a Read sig signal to be "Enable"); detects the phase difference based on the result of the comparison, and outputs the delay information (DQPHASE signal) as phase information indicating the phase difference.

The phase detecting unit 121 includes a sample and hold (S/H) circuit 213 and a phase detector 214. The sample and hold circuit 213 samples and holds the ddqs signal obtained by delaying the phase of the dqs90 signal by the first phase delay unit 132, and generates two clock signals for phase comparison.

The phase detecting unit 214 compares the two clock signals generated by the S/H circuit 213 with the signal output from the selector 202 (CLK0deg1 or CLK180deg1 signal) to detect the phase difference, and outputs the DQPHASE signal. The DQPHASE signal is an information signal indicating the delay amount of the DQS signal, is output from the signal receiving circuit 111 as phase difference information, and is output to the first phase delay unit 132 and the signal restoring circuit 112. The DQPHASE signal is inverted by the inverter 222; thereafter, is output to the selector 202 as a selection signal; and is also output to a selector 204 as a selection signal after being inverted by the DQPHASE signal inverter 223.

Figure 5:
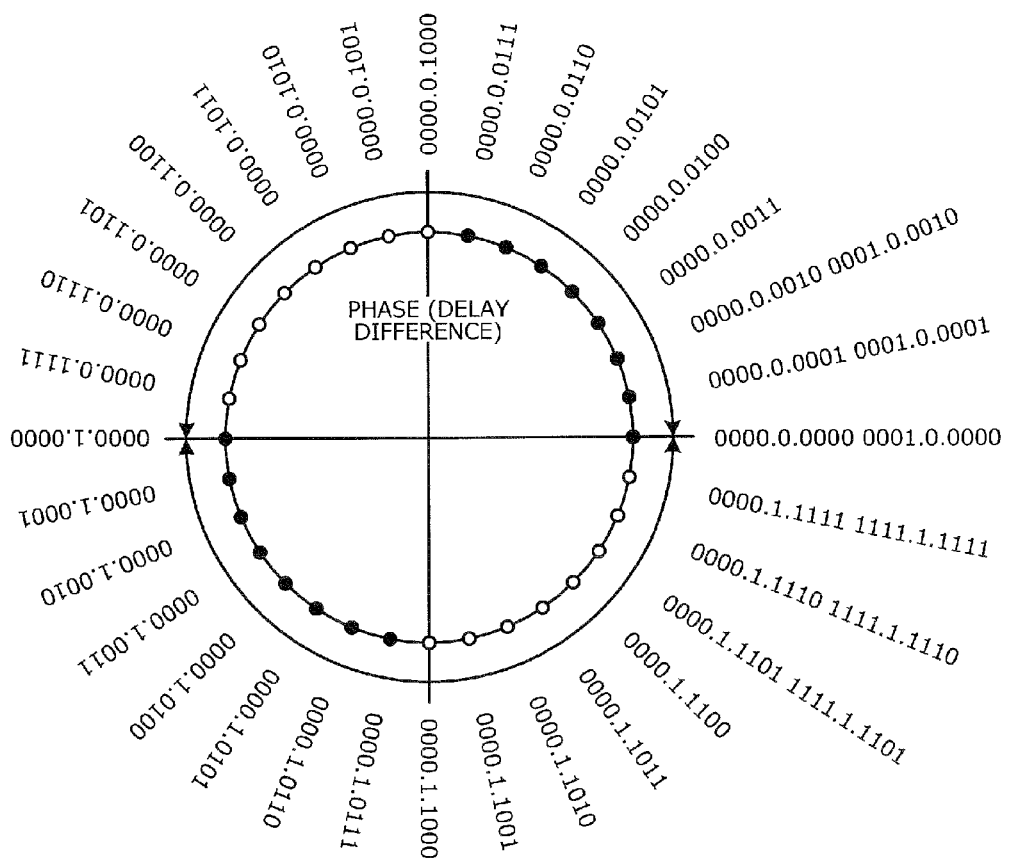
FIG. 5 is an explanatory diagram of an example of the phase of the DQPHASE signal.

FIG. 4 is an explanatory diagram of an example of the DQPHASE signal. FIG. 5 is an explanatory diagram of an example of the phase of the DQPHASE signal. The phase follow-up range is determined based on the number of bits that represents the DQPHASE signal. For example, the DQPHASE signal is an eight-digit binary number, is a digital amount having an arbitrary bit length as depicted in FIG. 4, and takes the initial value of, for example, "000000000". In the second example, one delay (0 to 15/16×180 degrees) is realized among the delays obtained by evenly dividing the 180-degree phase into 16. As depicted in FIG. 5, the delays are the angles represented by black circles, dotted circles, dashed circles, and white circles on the circumference.

The delays are depicted by evenly dividing the 360 degrees of one cycle into 32 and therefore, in FIG. 5, each DQPHASE signal in a first quadrant (I) is "xxxx0xxxx" and each DQPHASE signal in a second quadrant (II) is "xxxx1xxxx". When the delay goes m rounds, the DQPHASE signals have the same lower five bits.

Taking the DL 215 as an example and using a delay line, when the length of the delay line is infinite, the DL 215 alone can adjust the phase. However, in practice, the length of the delay line is finite and the DL 215 cannot alone adjust the phase. Although the DL 215 can add the delay, the DL 215 cannot reduce the delay.

In phase adjustment, when the delay is adjusted at the precision obtained by evenly dividing 180 degrees into 16 (evenly dividing 360 degrees into 32), the lowest four bits of the DQPHASE signal represents the adjustment amount that is less than 180 degrees. In this case, the one bit in the middle of the DQPHASE signal is information indicating which phase is used based on the unit of 180 degrees, and is used to select the clock signal retaining the phase delay based on the unit of 180 degrees (selected signal of each selector 202 and 204).

The highest four bits of the DQPHASE signal are a signal representing how many rounds the phase goes, and are a signal representing "minus seven to seven" described later. For example, the highest four bits of the DQPHASE signal are represented by a complement number of two; when the four bits are "0000", the complement number is zero; when the four bits are "0111", the complement number is seven; when the four bits are "1111", the complement number is minus one; and, when the four bits are "1001", the complement number is minus seven.

Returning back to the description with reference to FIG. 3, the second phase delay unit 133 changes the capture timing of the DQ signal using 180 degrees as a unit based on the DQPHASE signal obtained when the PHSEL INH signal changes from "L" to "H". Thereby, the second phase delay unit 133 changes its phase from the phase of the DQS signal to the clock phase of an internal signal.

The clock generating unit 141 includes a clock generator 203 and a selector 204. The clock generator 203 generates a multi-phase CLK signal. For example, the clock generator 203 may include a frequency-dividing circuit, and frequency-divides the CLK signal using the frequency-dividing circuit and generates the multi-phase CLK signal.

For example, the clock generator 203 obtains CLK signals of 1 [GHz] by frequency-dividing the CLK signal of 2 [GHz] into two and generates the CLK signals having two phases of zero degree and 180 degrees (respectively referred to as "CLK0 deg2 signal" and "CLK180 deg2 signal").

The selector 204 sets, to be a selection signal, a value obtained by inverting using the inverter 223 the DQPHASE signal (value of fifth bit from lowest one of DQPHASE signal described later) fixed by the PHSEL INH signal; and outputs to the second phase delay unit main body 142 either the CLK0 deg2 or the CLK180 deg2 signal based on the selection signal.

The second phase delay unit main body 142 includes FFs 218 and 219, and an inverter 220. The FF 218 synchronizes with the clock signal selected by the selector 204 using the inverse signal of the DQPHASE signal, captures the ddq-even signal, and outputs the ldq-even signal. The FF 219 synchronizes with a clock signal obtained by inverting using the inverter 220 the clock signal selected by the selector 204 using the inverse signal of the DQPHASE signal, captures the ddq-odd signal, and outputs the ldq-odd signal. Thereby, the ldq-even and the dq-odd signals are data signals that newly employ the internal clock phase.

For example, the first phase delay unit 132 may include a latch circuit to store therein the DQPHASE signal obtained when the DQPHASE signal changes from "L" to "H" and may output the signal output from the latch circuit, to the DLs 215 to 217. Thereby, even in a case where the phase detecting unit 121 continuously detects the DQPHASE signal, the DQPHASE signal used for the delay amount does not change when the DL2 DLIR INH signal is "H" during the time period for the first phase delay unit 132 to keep delaying the data signal.

The selector 126 selects any one among the ldq-even signal and the ldq-odd signal output from the second phase delay unit 133, based on the clock signal output from the selector 204. Therefore, the selector 126 outputs a data signal that is synchronized with the rising edge and the falling edge of the clock signal output from the selector 204.

The data retaining unit 127 synchronizes the data signal output from the selector 126 with the CLK signal, retains the data signal; and includes an FF 221. The FF 221 synchronizes the output from the selector 126 with the CLK signal (signal having a cycle twice as long as that of DQS signal), retains the output; and outputs the retained value to the signal restoring circuit 112 as the IN signal. Thereby, the IN signal can change the phase thereof from that of the DQS signal to that of the CLK signal.

The generating unit 122 generates new control signals by delaying the control signal. A detailed example of the generating unit 122 will be described with reference to FIG. 6.

Figure 6:
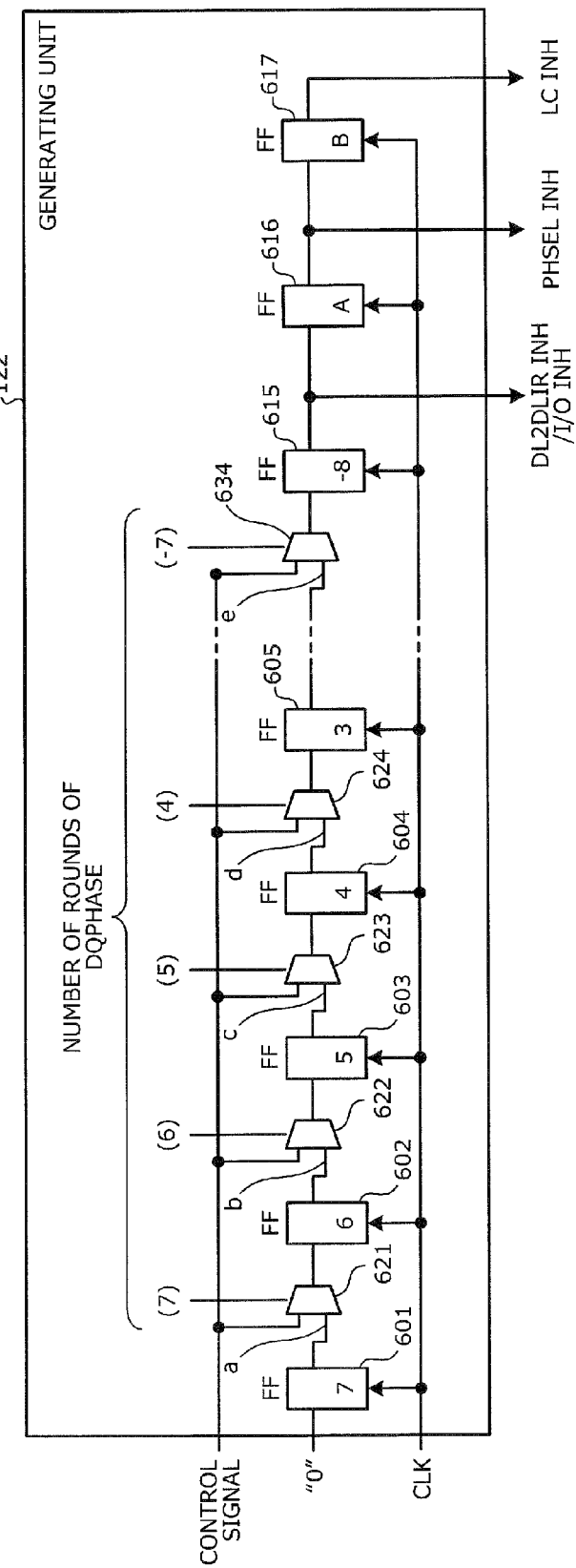
FIG. 6 is an explanatory diagram of a detailed example of a generating unit 122.

FIG. 6 is an explanatory diagram of a detailed example of the generating unit 122. The generating unit 122 generates the DL2 DLIR INH signal, the PHSEL INH signal, the I/o INH signal, and the LC INH signal by delaying the control signal corresponding to the DQPHASE signal. For example, the generating unit 122 includes plural storage elements (FFs 601 to 617) and plural selectors 621 to 634.

The FFs 601 to 615 store the control signals, arrange the control signals in order of input thereof from the arrangement starting position based on the number of rounds of the DQPHASE signal; and output the stored control signals in order of the arrangement and in synchronization with the CLK signal. The output results are the DL2 DLIR INH and the I/O INH signals.

The FF 616 captures the output of the FF 615 in synchronization with the CLK signal and outputs the PHSEL INH signal. The FF 617 captures the output of the FF 616 in synchronization with the CLK signal and outputs the LC INH signal.

The selectors 621 to 634 are storage control units that control the FFs 601 to 615, and each selects the arrangement starting position based on the number of rounds of the DQPHASE signal. For example, the FFs 601 to 615 are connected to each other like a shift register through the selectors 621 to 634.

The delay amount between the PHSEL INH signal and the DL2 DLIR INH and the I/O INH signals, and the delay amount between the PHSEL INH signal and the LC INH signal are determined by the design of the memory controller 100.

In the example of the memory controller 100 of FIG. 3, passage of the data signal through the second phase delay unit 133 is later than the passage thereof through the first phase delay unit 132 and the phase setting unit 125, by a time period corresponding to one clock. Therefore, the FF 616 is disposed between the PHSEL INH signal and the DL2 DLIR INH and the I/O INH signals.

In the example of the memory controller 100 of FIG. 3, passage of the data signal through the signal storing circuit 112 is later than passage thereof through the second phase delay unit 133, by a time period corresponding to one clock. Therefore, the FF 617 is disposed between the LC INH and the PHSEL INH signal.

In the example depicted in FIG. 6, an example of a case is taken where x is x=0. However, when x is x=6, the six FFs are disposed in the form of a shift register (FIFO) downstream from the FF 615 and upstream to the DL2 DLIR INH signal. In FIG. 6, nodes "a" to "e" are additionally depicted to describe timing charts depicted in FIGS. 7 and 8.

Figure 7:
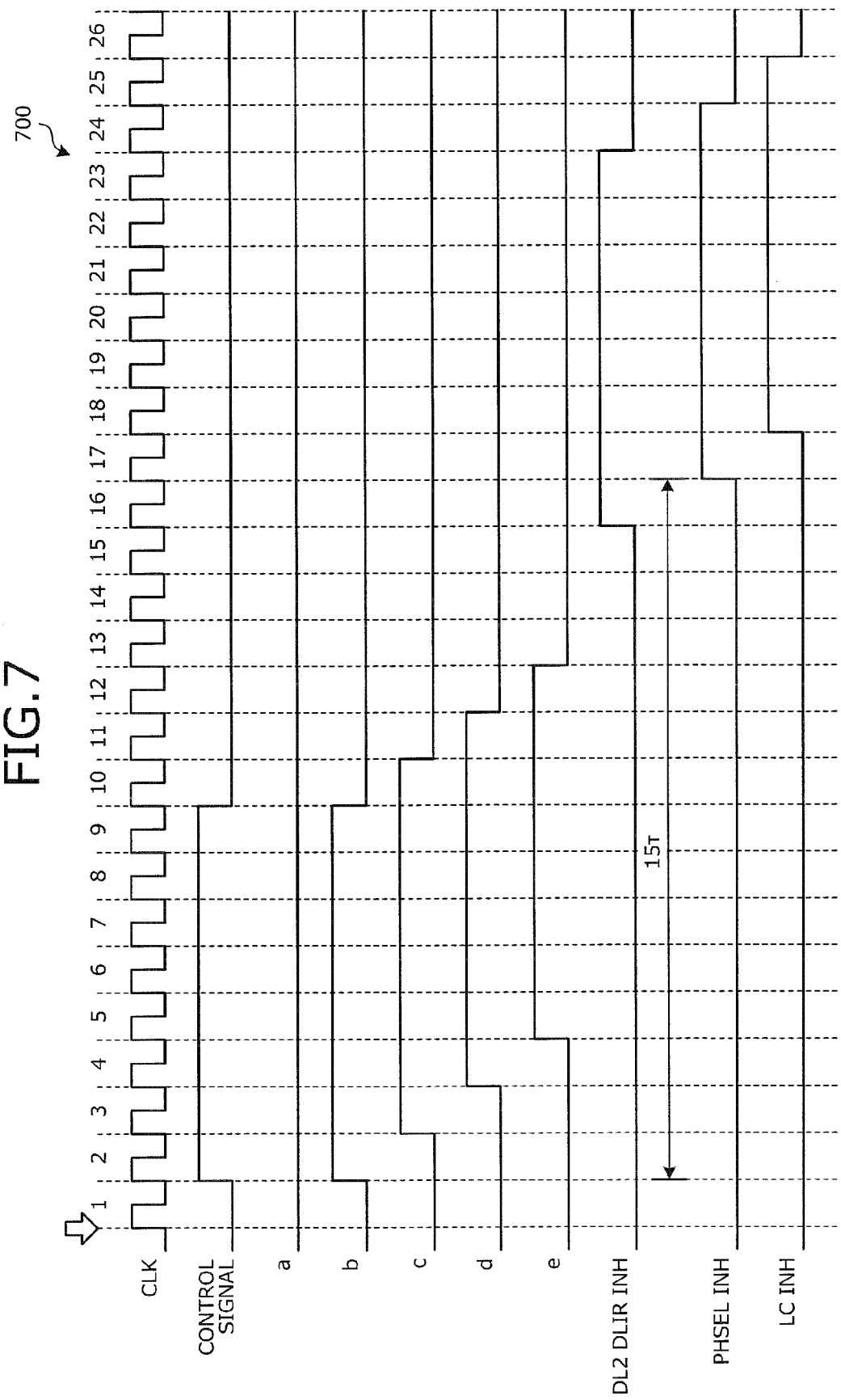
FIG. 7 is a timing chart (Part I) of an operation example of the generating unit 122.

FIG. 7 is the timing chart (Part I) of an operation example of the generating unit 122. In the timing chart 700, for easy understanding, reference numerals are sequentially given to the CLK signal taking a section from the rising edge of the CLK signal to a point immediately before the next rising edge thereof as one cycle. In FIG. 7, the rising edge of the first clock is a position indicated by an arrow. In the example depicted in FIG. 7, the number of rounds of the DQPHASE signal is seven.

In the timing chart 700, the control signal changes from "L" to "H" at the rising edge of the second clock and is "H" during the time period corresponding to the read time of one data signal. Because the number of rounds of the DQPHASE signal is seven, the selector 621 selects and outputs the control signal. Therefore, the node a, which is the output of the FF 601, is still "L".

The node b, which is the output of the FF 602, changes from "L" to "H" at the rising edge of the second clock. The node c, which is the output of the FF 603, changes from "L" to "H" at the rising edge of the third clock. The node d, which is the output of the FF 604, changes from "L" to "H" at the rising edge of the fourth clock. The node e, which is the output of the FF 605, changes from "L" to "H" at the rising edge of the fifth clock.

The DL2 DLIR INH and the I/O INH signals each change from "L" to "H" at the rising edge of the sixteenth clock. The PHSEL INH signal changes from "L" to "H" at the rising edge of the seventeenth clock. The LC INH signal changes from "L" to "H" at the rising edge of the eighteenth clock.

Therefore, when the number of rounds of the DQPHASE signal is seven, the time period is $16\tau$ from the time of the rising edge of the control signal until the time of the rising edge of the PHSEL INH signal. As for $x\tau+(i \text{ to } 1)\tau$ depicted in FIG. 2, because x is zero and the number of rounds of the DQPHASE signal is seven, $x\tau+(i \text{ to } 1)\tau$ is $15\tau$. The number of rounds "−7 to 7" of the DQPHASE signal corresponds to "1 to 15" of "i".

Figure 8:
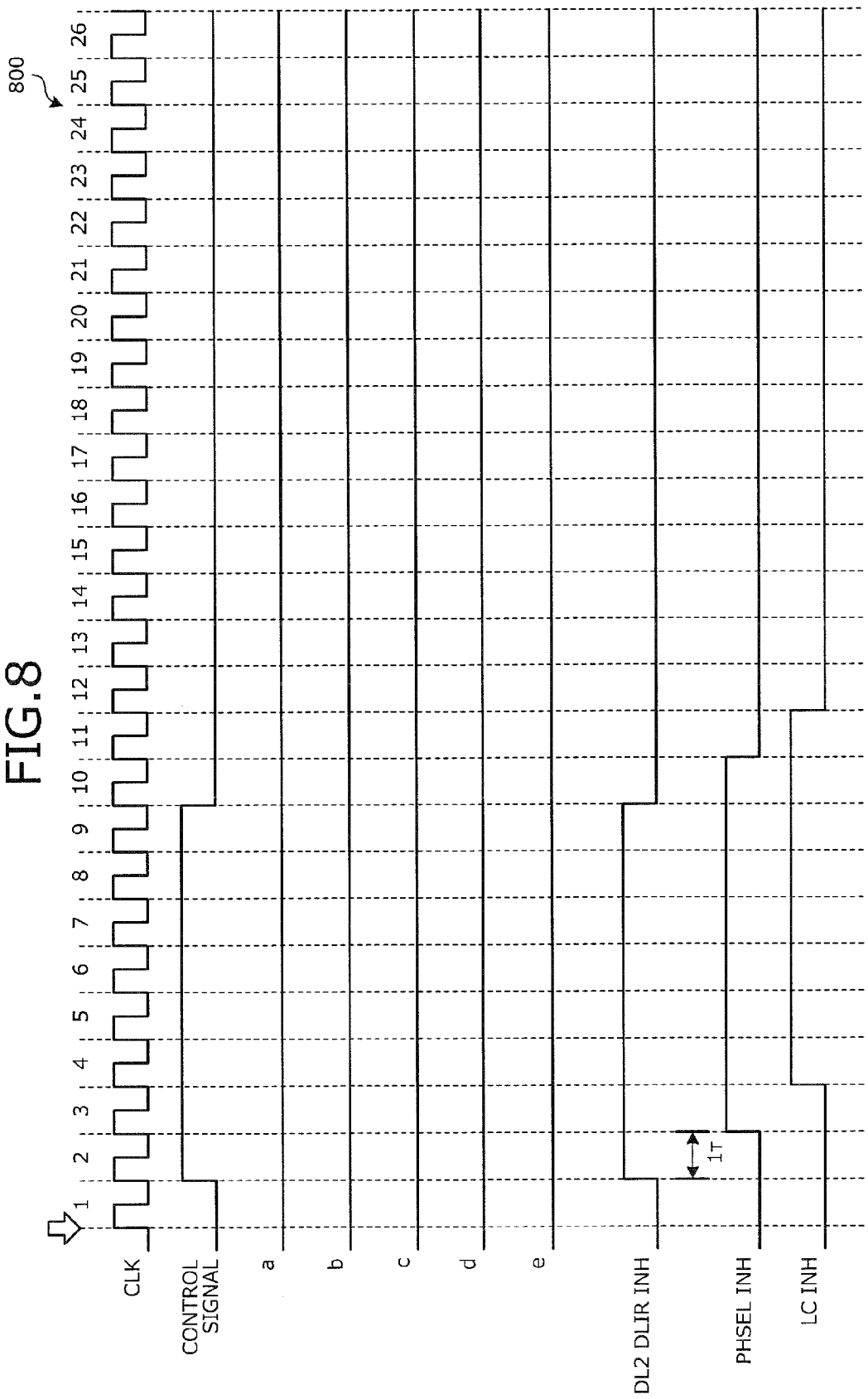
FIG. 8 is a timing chart (Part II) of an operation example of the generating unit 122.

FIG. 8 is a timing chart (Part II) of an operation example of the generating unit 122. In the example depicted in FIG. 8, the number of rounds of the DQPHASE signal is "−7". In the timing chart 800, the control signal changes from "L" to "H" at the rising edge of the second clock and is "H" for the time period corresponding to the read time for one data signal. Because the DQPHASE signal is "−7", the selector 634 selects and outputs the control signal.

The selectors 621 to 633 other than the selector 634 each uses the output of the FF immediately upstream as input. Therefore, the signal at each of the nodes a to e is still "L". The DL2 DLIR INH signal changes from "L" to "H" at the rising edge of the second clock. The PHSEL INH signal changes from "L" to "H" at the rising edge of the third clock. The LC INH signal changes from "L" to "H" at the rising edge of the fourth clock.

Therefore, when the number of rounds of the DQPHASE signal is "−7", the time period is 1T from the time of the rising edge of the control signal until the time of the rising edge of the PHSEL INH signal. As for $x\tau+(i \text{ to } 1)T$ depicted in FIG. 2, because x is zero and the number of rounds of the DQPHASE signal is "−7", xτ+(i to 1)τ is 1T. The number of rounds "−7 to 7" of the DQPHASE signal corresponds to "1 to 15" of "i".

Returning back to the description with reference to FIG. 3, the signal restoring circuit 112 realizes a process of restoring the pulse width of the IN signal by executing the delay control for the IN signal corresponding to the DQPHASE signal obtained when the LC INH signal changes from "L" to "H". For example, the signal restoring circuit 112 has the FIFO function that is sufficient to absorb deviations in the delay of data, and increases or decreases the delay time period for passing through the FIFO corresponding to the delay amount retained by the DQPHASE signal. Thereby, the delay of the received signal output from the signal receiving circuit 111, that is, the DQ signal is maintained to be constant and the data pulse width is restored.

Figure 9:
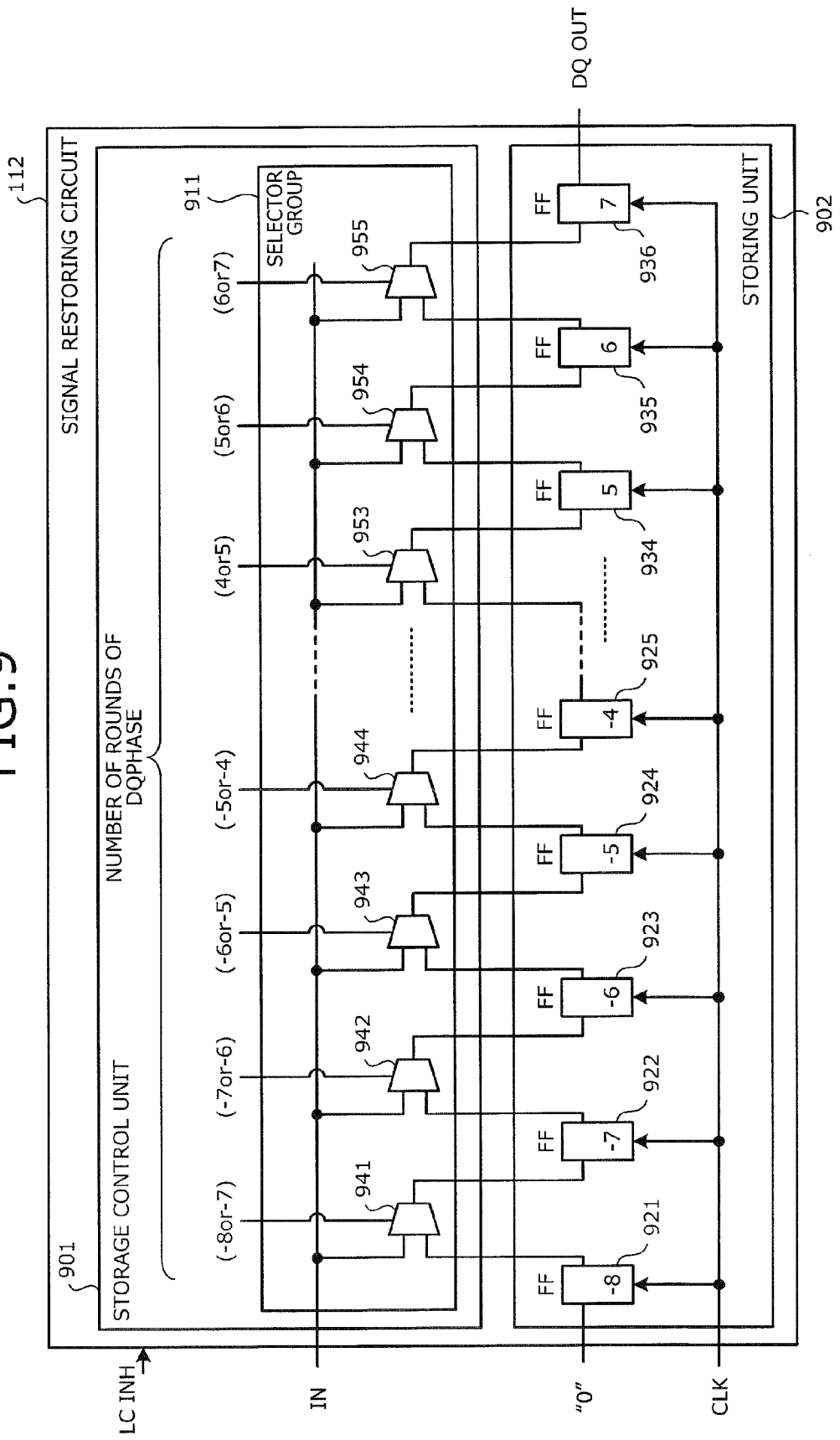
FIG. 9 is an explanatory diagram of a detailed example of a signal restoring circuit 112.

FIG. 9 is an explanatory diagram of a detailed example of the signal restoring circuit 112. The signal restoring circuit 112 includes a storing unit 902 and a storage control unit 901. The storing unit 902 can store therein each IN signal, arranged in order of input thereof, and from the storing unit 902, the IN signals can be read in order of the arrangement. The storing unit 902 includes FFs 921 to 936.

The storage control unit 901 selects the arrangement starting position in the storing unit 902, based on the DQPHASE signal obtained when the LC INH signal changes from "L" to "H". For example, the storage control unit 901 includes a selector group 911. The selector group 911 includes selectors 941 to 955.

The selection signal supplied to the selectors 621 to 634 included in the generating unit 122, and the selection signal supplied to the selectors 941 to 955 included in the signal restoring circuit 112 are inverses of one another. In the generating unit 122 and the signal restoring circuit 112, the handling of the DQPHASE signal is the inverse of one another. Thereby, the sum of the delay amount attached to the read data and that attached to the control signal can be maintained to be constant.

Figure 10:
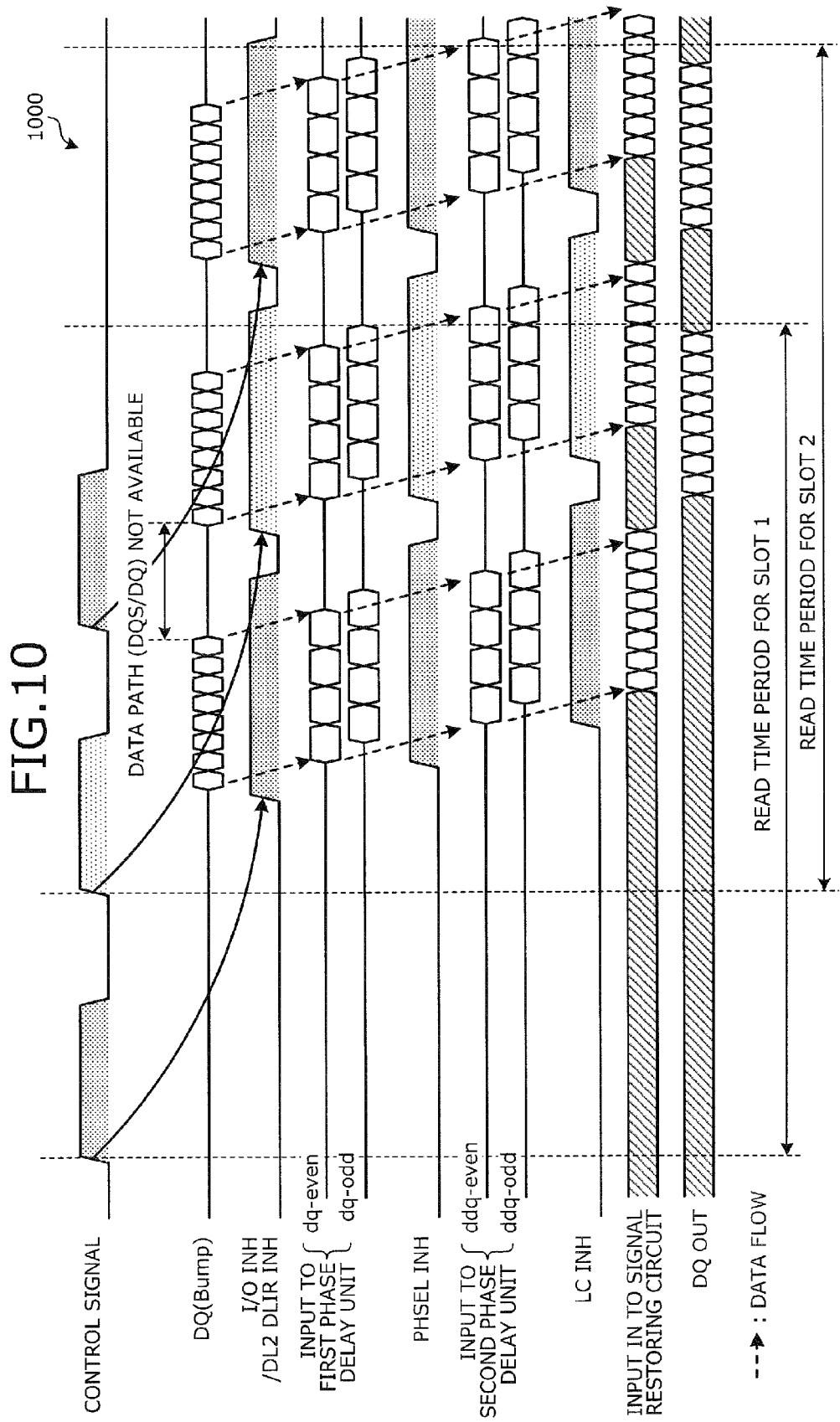
FIG. 10 is an explanatory diagram of an example in which read operations are successively executed with respect to memory 101.

FIG. 10 is an explanatory diagram of an example in which read operations are successively executed with respect to the memory 101. A timing chart 1000 depicts a case where, when the memory 101 includes slots 1 and 2, the memory controller 100 successively executes read operations for the slots 1 and 2.

In the timing chart 1000, even during the read time for the slot 1, the valid time periods of the control signals (time periods each for control signal to be "H") do not overlap with each other. Therefore, in the timing chart 1000, a section corresponding to a time period defined from the first rising edge of the control signal until the next rising edge thereof (in the example of DDR3, 6tCK) is left to be blank; and the read operation for the slot 2 is started with the next rising edge of the control signal. Therefore, when read operations are successively executed, the total read time can be reduced by setting the valid time period of the control signal to be equal to or longer than the read time for one data signal and less than the specific time period. Not only the read operations but also write operations can be executed and therefore, operation switching at a higher speed can be executed for the overall circuit, enabling increased speed of the operation switching.

The DQPHASE signal used in each of the components is fixed based on the control signal such that the continuously changing DQPHASE signal does not change when the data signal passes through each of the components and thereby, generation of logical whisker pulses can be prevented. According to the second example, the same effect as that of the first example can be achieved.

In a third embodiment, when plural read destination memories (DIMMs) are present, the data signal can be delayed by a delay amount suitable for each of the read destination memories, by disposing for each of the memories, a phase detecting unit that detects the delay amount. Thereby, even for operation in which plural memories are accessed successively, switching of the operations can be executed at a high speed. Therefore, the overall operation time period can be reduced. In the third embodiment, components identical to those of the first and the second embodiments are given the same reference numerals used in the first and the second embodiments, and will not again be described.

Figure 11:
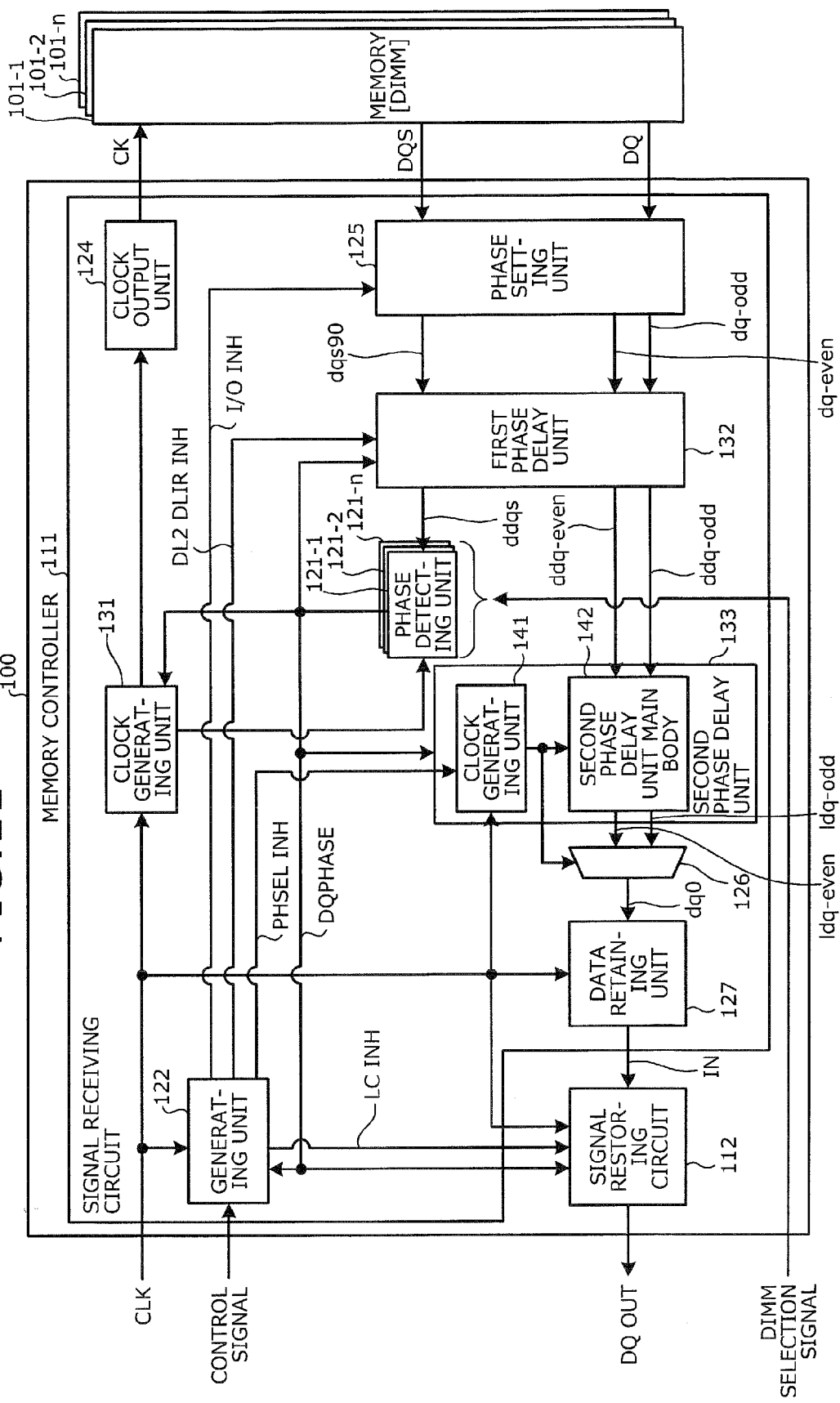
FIG. 11 is a block diagram of an example of the semiconductor apparatus according to third embodiment.

FIG. 11 is a block diagram of an example of the semiconductor apparatus according to the third embodiment. FIG. 11 depicts an example where plural memories 101 (memories 101-1 to 101-n (n≥2)) are present. The phase detecting unit 121 is disposed for each of the memories 101. Among the phase detecting units 121-1 to 121-n, the phase detecting unit 121 corresponding to the memory 101 to be read is selected based on a DIMM selection signal.

The phase detecting units 121-1 to 121-n each stores the DQPHASE signal obtained when the read time for the corresponding memory 101-1 to 101-n comes to an end.

Figure 12:
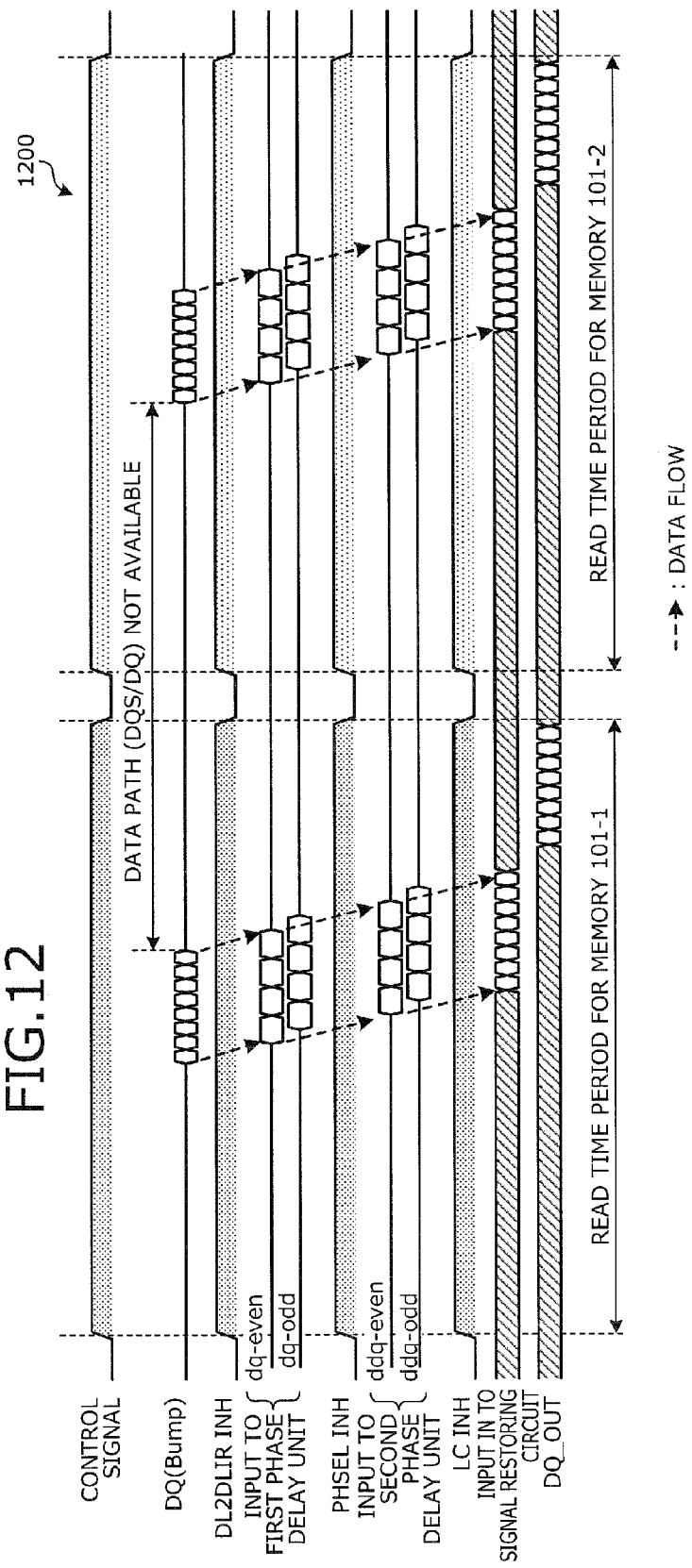
FIG. 12 is an explanatory diagram of an example of a conventional case in which read operations are successively executed for plural memories 101.
Figure 13:
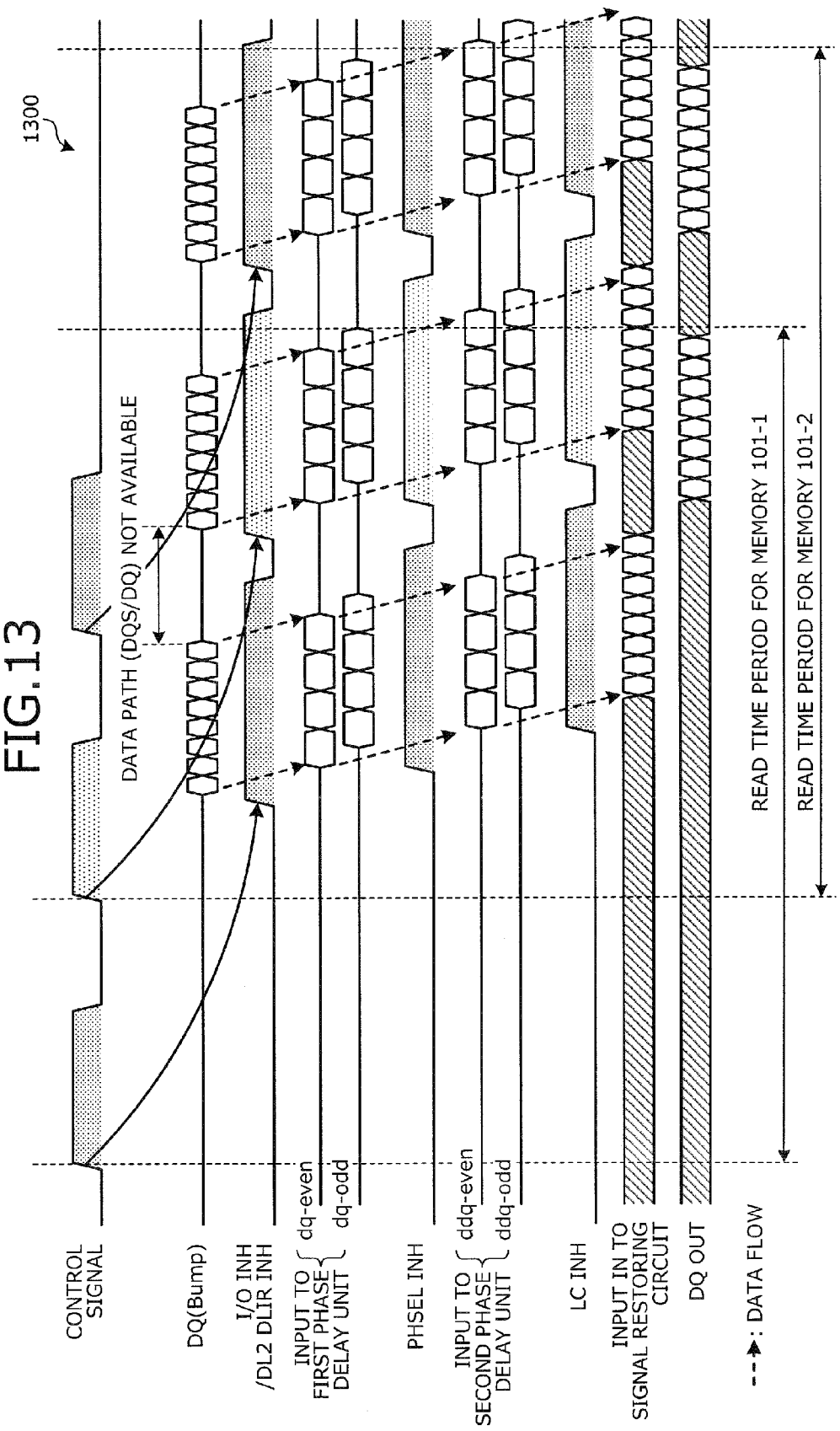
FIG. 13 is an explanatory diagram of an example of third embodiment for a case in which read operations are successively executed for the plural memories 101.

FIG. 12 is an explanatory diagram of an example of a conventional case in which read operations are successively executed for the plural memories 101. FIG. 13 is an explanatory diagram of an example of the present embodiment for a case in which read operations are successively executed for the plural memories 101. In a timing chart 1200, the control signal is "H" during the read time from the start of the read operation until the end thereof for each of the read operations. On the other hand, in a timing chart 1300, the control signal is "H" during the time period corresponding to the read time for one data signal from the start of the read operation, for each read operation.

According to the third embodiment, the switching of the operations can be executed at a high speed even for operation in which different DIMMs are successively accessed. Therefore, the overall operation time period can be reduced.

In a fourth embodiment, an example will be described where the clock generating units described in the first and the second embodiments are replaced by one unit to be commonly used. In the fourth embodiment, components identical to those of the first and the second embodiments will be given the same reference numerals used in the first and the second embodiments, and will not again be described in detail.

Figure 14:
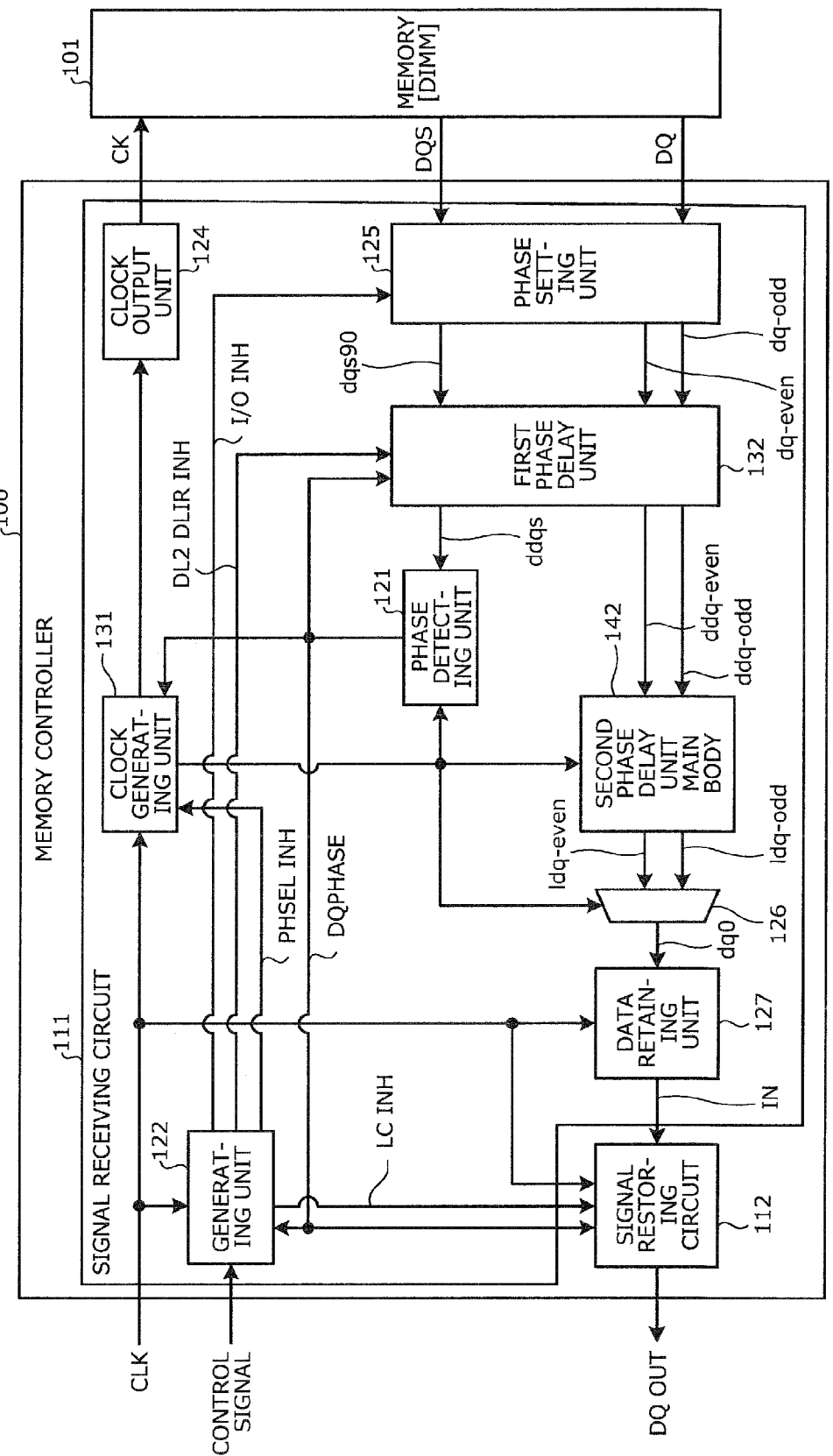
FIG. 14 is a block diagram of an example of the semiconductor apparatus according to fourth embodiment.

FIG. 14 is a block diagram of an example of the semiconductor apparatus according to the fourth embodiment. In the fourth embodiment, the second phase delay unit 133 does not include the clock generating unit 141 and the phase delay unit main body 142 uses the output of the clock generating unit 131. Therefore, the PHSEL INH signal is input into the clock generating unit 131.

The clock generating unit 131 frequency-divides the CLK signal; generates a multi-phase CLK signal; selects one CLK signal from the multi-phase CLK signal based on the DQPHASE signal obtained when the PHSEL INH signal changes from "L" to "H"; and outputs the selected CLK signal to the second phase delay unit main body 142 and the phase detecting unit 121. For example, the clock generating unit 131 may include a latch circuit to store therein the DQPHASE signal obtained when the PHSEL INH signal changes from "L" to "H."

According to the fourth embodiment, the same effect as those of the first and the second embodiments can be achieved. According to the fourth embodiment, the clock generating unit 141, which is the same as the clock generating unit 131, is not included and thereby, the scale of the circuit of the memory controller 100 can be reduced compared to those of the first and the second embodiments.

The memory controller 100 described in the first to the fourth embodiments may be disposed on, for example, a circuit board such as a motherboard to which the memory 101 board is attached.

FIG. 15 is a block diagram of an example of a motherboard. As depicted in FIG. 15, a motherboard 1500 has a CPU 1501 and a socket 1502 disposed thereon. The CPU 1501 is equipped with the memory controller 100. A memory board 1503 is attached to the socket 1502. Plural sockets 1502 may be disposed on the motherboard 1500.

As described, according to the semiconductor apparatus described in the first to the fourth embodiments, even when the valid time period of the control signal to fix the delay amount of the continuously varying data signal is shorter than the read time, the control signal is delayed and thereby, is made effective during the delay process executed for the data signal. The sum of the delay amount for delay the control signal and the delay amount for delay the data signal is set to be constant. Thereby, the valid time period of the control signal can be reduced and the speed of the switching of the plural operations can be increased during the successive operations, suppressing deviations in reading responses. Therefore, the overall operation time period can be reduced for the successive operations.

When the control signals are input in the arrangement in order of input thereof and are output in order of the arrangement, the delay amount of the control signal can be adjusted by controlling the first input position in the arrangement. When the data signals are input into the arrangement in order of input thereof and are output in order of the arrangement, the delay amount of the data signal can be adjusted by controlling the second input position in the arrangement. The first arrangement starting position and the second arrangement starting position are inverses of one another and thereby, the sum of the delay amount of the control signal and that of the data signal can be set to be constant.

According to an aspect of the embodiment, an effect is achieved that the memory controller absorbs the deviation, enabling the speed at which operations are switched can be increased when successive operations are executed.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor apparatus comprising:
a phase detecting unit that continuously detects a first delay amount during a read operation, based on a phase difference between a received external clock signal and an internal clock signal;
a generating unit that generates a second control signal by delaying a first control signal by a second delay amount that when added to the first delay amount, a sum of the first and the second delay amounts is a specific time period, a valid time period of the first control signal starts at a start of the read operation and is at least to equal a read time for one data signal and less than the specific time period that is from the start of the read operation until output of a received data signal; and
a delay control unit that delays the data signal by the first delay amount that is detected by the phase detecting unit at a start of a valid time period of the second control signal generated by the generating unit.

2. The semiconductor apparatus according to claim 1, wherein
the generating unit comprises:
a first storing unit that stores in order of input and arranged from a first arrangement starting position, each first control signal, and outputs each first control signal as the second control signal in order of arrangement; and
a first storage control unit that selects the first arrangement starting position based on the second delay amount.

3. The semiconductor apparatus according to claim 2, wherein
the delay control unit comprises:
a second storing unit that stores in order of input and arranged from a second arrangement starting position, each data signal, and enables each data signal to be read out in order of arrangement; and
a second storage control unit that selects the second arrangement starting position based on the first delay amount.

4. The semiconductor apparatus according to claim 3, wherein
the first storing unit and the second storing unit have an identical number of arrangements, and
the first arrangement starting position and the second arrangement starting position are inverses of one another.

* * * * *